United States Patent [19]

Schladitz

[11] 4,097,624

[45] Jun. 27, 1978

[54] METHOD FOR THE METALLIZATION OF FIBERS

[75] Inventor: Hermann J. Schladitz, Munich, Germany

[73] Assignee: University of Virginia, Charlottesville, Va.

[21] Appl. No.: 838,063

[22] Filed: Sep. 30, 1977

Related U.S. Application Data

[62] Division of Ser. No. 763,013, Jan. 27, 1977.

[51] Int. Cl.² .......................... B05D 3/04; B05D 7/20
[52] U.S. Cl. .................................. 427/251; 427/252; 427/255; 427/314; 427/319
[58] Field of Search ........... 427/248 R, 248 A, 248 B, 427/248 G, 248 C, 249, 251, 255, 250, 252, 253, 91, 111, 112, 117, 118, 120, 124, 314, 316, 318; 118/48–49.5

[56] References Cited

U.S. PATENT DOCUMENTS

| | | | |
|---|---|---|---|
| 1,412,762 | 4/1922 | Underwood et al. | 118/49 |
| 2,864,931 | 12/1958 | Stoddard et al. | 219/388 S |
| 2,884,337 | 4/1959 | Homer et al. | 427/251 |
| 2,887,088 | 5/1959 | Nack | 118/48 |
| 2,893,895 | 7/1959 | Claussen | 118/48 X |
| 3,441,454 | 4/1969 | Shaikh | 118/48 X |
| 3,721,520 | 3/1973 | Bloom | 432/8 X |
| 3,865,074 | 2/1975 | Cornelissen et al. | 118/49.5 |
| 3,883,718 | 5/1975 | Ferment et al. | 219/388 S |
| 3,944,686 | 3/1976 | Froberg | 118/48 X |
| 4,031,851 | 6/1977 | Camahort | 427/251 X |

*Primary Examiner*—Morris Kaplan
*Attorney, Agent, or Firm*—Oblon, Fisher, Spivak, McClelland & Maier

[57] ABSTRACT

A method for decontaminating and subsequently metallizing a filament comprises:

passing the filament through the inner tube of a first chamber for decontamination which comprises two concentric tubes having an annular space therebetween, the inner tube of which has a series of fine holes therein; wherein said inner tube is heated and said annular space contains an inert gas such that said gas flows through said holes in heated jet streams which impinge upon said filament, thereby heating and decontaminating said filament;

passing said heated and decontaminated filament into a second chamber for metallization also comprising two concentric tubes having an annular space therebetween, the inner tube of which has a series of fine holes therein; wherein said inner tube of said second chamber is heated and said annular space of said second chamber contains a gaseous, thermally decomposable metal compound such that said gaseous metal compound flows through said holes in heated jet streams and impinges upon said heated and decontaminated filament, thereby thermally decomposing said metal compound and metallizing said filament. An apparatus for carrying out this method is also provided, a key feature of which is an intermediate chamber communicating with an end of each the first and second chambers and having a thin membrane disposed transversely therein. The wire passes from the decontamination chamber through a pinhold in the membrane and through the metallization chamber.

8 Claims, 3 Drawing Figures

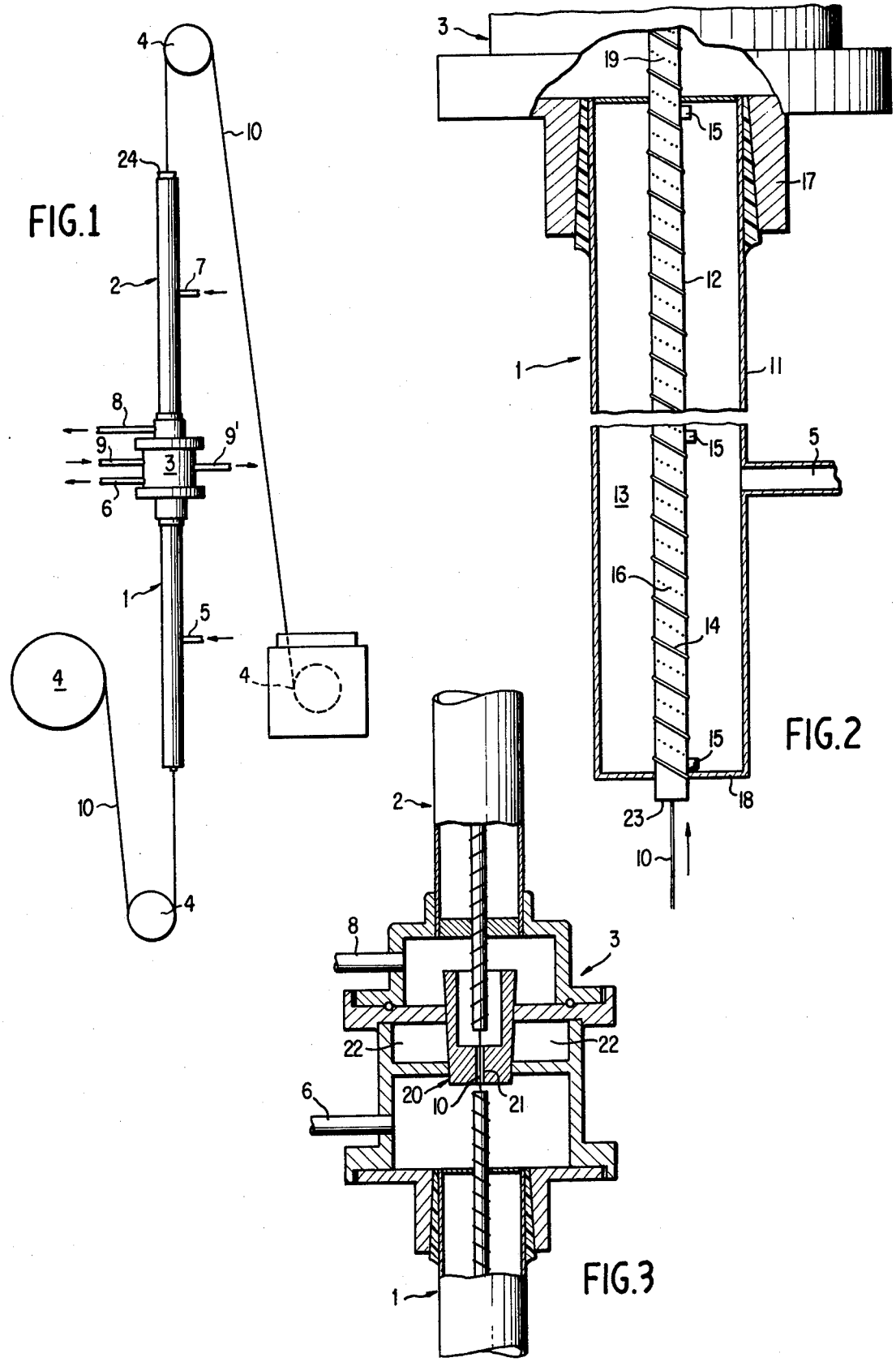

METHOD FOR THE METALLIZATION OF FIBERS

This is a division, of application Ser. No. 763,013 filed Jan. 27, 1977.

BACKGROUND OF THE INVENTION

1. Field of the Invention

This invention relates to the metallization of filaments and particularly to the metallization of fibers using a decomposable metal compound.

2. Description of the Prior Art

One of the major difficulties encountered in conventional fiber metallization techniques is the satisfactory cleaning of the substrate prior to the metallization step. This is a particularly critical problem for chemical vapor deposition (CVD) metallization methods. Unless all contaminants such as dirt, grease, oil, water and the like are removed, the subsequent metal coating will be inferior. For example, the coating often is nonuniform, unsmooth, discontinuous, incoherent and/or porous, etc. Moreover, the crystallite size is often too large producing a rough surface pattern and surface contamination is often bound by the coating. Not only must these contaminants be removed from the surface of the substrate to be metallized, but in the case of a structured substrate such as a fibrous filament or bundle, the contaminants must also be removed from all underlying surfaces of the individual fibers making up the overall substrate, since the metal coating will also reach these areas.

Another critical problem for metallization of substrates, such as fibers, is the attainment of a hole-free, continuous coating even on a satisfactorily cleaned substrate. Because of the interaction between the intricate structure of a bundle of fibers and the metal source, such as a metal vapor for CVD, many small areas in the bundle are not coated at all or are coated with a significantly thinner layer of metal than the nominal coating thickness. This phenomenon is caused, for example, by shadowing of underlying areas by surface fibers and/or inability to bring a sufficient amount of the metal vapor into close contact with the underlying fibers. Of course, contamination of the surface can also cause this effect.

In the past, fibers have been decontaminated for metallization by heat treatments at temperatures around 350° C for long periods of time, e.g., around 24 hours, prior to processing. Alternatively, chemical treatment has also been used.

In order to seal any holes in the conventional metal layers, many repeated treatments are necessary. For example, in galvanic plating, coating thicknesses of about 40 $\mu$m are required to obtain a hole-free coating. For conventional CVD metallization, a thickness of about 17 $\mu$m is required.

Not only have these solutions not been completely effective, but they are also inefficient, time consuming and costly. A method is still needed to effectively and efficiently decontaminate substrates, especially fibers, for metallization processing. Moreover, a method for eliminating the formation of discontinuities in the subsequently applied metal coating is also needed.

SUMMARY OF THE INVENTION

Accordingly, it is an object of the present invention to provide a method for effectively decontaminating substrates, especially fibrous substrates, prior to metallization.

It is another object of this invention to provide such a method which simultaneously enables metallization of the decontaminated substrate such that a smooth, continuous, uniform and non-porous coating results.

It is still another object of this invention to provide such a method which enables decontamination and metallization to be performed continuously in a short period of time with minimal energy and materials consumption.

Briefly, these and other objects of this invention which will hereinafter become clear have been attained by providing a method for decontaminating and subsequently metallizing a filament which comprises:

passing the filament through the inner tube of a first chamber for decontamination which comprises two concentric tubes having an annular space therebetween, the inner tube of which has a series of fine holes therein; wherein said inner tube is heated and said annular space contains an inert gas such that said gas flows through said holes in heated jet streams which impinge upon said filament, thereby heating and decontaminating said filament;

passing said heated and decontaminated filament into a second chamber for metallization also comprising two concentric tubes having an annular space therebetween, the inner tube of which has a series of fine holes therein; wherein said inner tube of said second chamber is heated and said annular space of said second chamber contains a gaseous, thermally decomposable metal compound such that said gaseous metal compound flows through said holes in heated jet streams and impinges upon said heated and decontaminated filament, thereby thermally decomposing said metal compound and metallizing said filament.

The apparatus comprises suitable means for effecting the method of this invention as described below.

BRIEF DESCRIPTION OF THE DRAWINGS

A more complete appreciation of the invention and many of the attendant advantages thereof will be readily attained as the same becomes better understood by reference to the following detailed description when considered in connection with the accompanying drawings, wherein:

FIG. 1 illustrates one embodiment of the entire apparatus of this invention;

FIG. 2 illustrates a cross-sectional view of the chamber (1) or (2) of FIG. 1; and FIG. 3 illustrates a cross-sectional view of the chamber (3) of FIG. 1.

DETAILED DESCRIPTION OF THE PREFERRED EMBODIMENTS

As can be seen from the above summary, the method of this invention involves the passage of a fibrous filament through two successive tubes. One of the important features of this invention regards the provision of the fine apertures in the inner tubes of these chambers. It is theorized that the combination of the small diameter of the holes and the increase in kinetic energy of the gas which is heated by the hot surface of the inner tube, results in a nozzle-like effect. In other words, the heated gas surrounding the holes creates a localized pressure build-up and, as a result the heated gas is forced through the holes in a jet stream. This jet stream is generally directed radially within the inner tube and impinges upon the filament passing therein in a turbulent flow of hot, dry gas. In the first chamber, the result is that the surfaces of the entire fiber bundle are thoroughly cleaned throughout its volume. Simultaneously, the fibrous filament is heated to an appropriately high temperature, such that in the second chamber the gaseous metal compound will be decomposed upon contact with it. In this second chamber, the result of the turbulent flow is that the surfaces of all exposed fibers in the filament become evenly metallized with no discontinuities in the metal layer. In both chambers, the turbulent action of the jet streams permits the metal atoms to come into contact with all exposed surfaces, cleaning all such areas in the first chamber and metallizing them in the second chamber, including those areas which conventionally represent potential holes in the resultant coating. As a result, hole-free coatings are obtainable with thicknesses of only a few micrometers, generally from 0.05-5 $\mu$m, typically from 1-5 $\mu$m, and preferably from 1-2 $\mu$m, instead of the conventional 17-40 $\mu$m coatings discussed above. Moreover, the turbulent flow enables highly efficient and fast heat transfer over the entire surface area of the filament. Consequently, both the decontamination and metallization steps can be performed very rapidly.

The method of this invention is generally applicable to any endless type of substrate such as a filament, strand, thread, rod, macroscopic fiber, fibrous bundle and the like. It is especially applicable to fibrous filaments or strands since the action of the jet streams enables superior metallizations of these substrates, heretofore unachievable with conventional technology as explained above. Suitable fibers for metallizing by this invention include all natural and all man-made fibers such as carbon, graphite, glass, quartz, asbestos, polycarbonates, polyacrylonitriles, polyesters, polyamides, and Keflar. The latter has strength higher than steel, but has poor bonding. If metallized, it could be bonded to resins.

The thermally decomposable metal compounds suitable for use in this invention are conventional and include carbonyls, nitrosyls, ethylacetonates and the like of the desired metal. Typical metals include nickel, nickel-iron alloys, molybdenum, tungsten, chromium, platinum, and all alloys thereof. The decomposable metal compound can be used alone or diluted with one of the inert gases suitable for use in the decontamination chamber of this invention. Suitable such inert gases include He, Ar, $CO_2$, $H_2$, CO, $N_2$ or inert organic vapors such as ethyl alcohol, freon, etc, or a mixture thereof.

The pressure of the gas in the annular region of the decontamination chamber should be from 25 to 150 mm Hg, preferably from 50 to 100 mm Hg. The pressure is maintained in the chamber simply by the flow resistance of the small holes. The inert gas need not be pre-heated, since it is heated in the chambers. The temperature of the inner tube is selected so that the temperature of the jets of gas are as high as possible, but below the decomposing temperature of the filament being processed. It also, of course, depends upon the rate at which the filament is flowing through the tube. Temperature selection can be made in accordance with these constraints by simple testing in conventional fashion. For example, carbon or quartz filaments can be heated to several hundred degrees, while polycarbonate filaments can be heated to only about 150° C. Thus the gas should reach this same temperature while the inner tube should reach a temperature sufficient to heat the gas to such a temperature, i.e., the tube temperature will be somewhat higher. This temperature, of course, is also selected to heat the inert gas so that it reaches a suitably high temperature to result in turbulent, jet stream flow; to heat the substrate sufficiently to decontaminate it, and to heat the substrate to a temperature high enough that when the metal compound in the second chamber contacts it, the compound will be thermally decomposed at a slower rate.

The temperature of the filament in the decontamination chamber will vary with the filament as discussed above. For nickel carbonyl, for example, the temperature is from 100° to 170° C, preferably from 140° to 170° C. In general, the operating conditions of the decontamination chamber, as well as those of the intermediate chamber between the decontaminating chamber and the metallization chamber, discussed below, should be chosen so that the filament maintains a temperature sufficiently higher than that in the metallization chamber so that the cooling effects upon passage through the intermediate chamber will not lower its temperature below the minimum value useable in the metallization chamber. Of course, the preferred temperature range will vary somewhat with the decomposition temperature of the metal compound. The temperature in either chamber can be conveniently maintained for example, by wrapping conventional insulated heating wire or tape around the exterior of the tube, for example, in a spiral configuration. Any configuration is suitable as long as it results in acceptably uniform heating of the tube and permits access of the gas to the holes in the tube as described below.

The size of the holes in both chambers is not critical, but is important, since the smallest holes possible will give the best heat transfer to the gas flowing through them. In order to assure proper jet stream formation and turbulent flow within the inner tube, the holes in either chamber should be from 0.1 to 0.5mm, preferably from 0.1 to 0.3mm, in diameter. The arrangement of the holes in both chambers is not particularly critical but, of course, they should be arranged throughout the length of the tube in a manner such that the entire substrate surface is decontaminated or evenly metallized. A preferred configuration is a spiral pattern of holes with a maximum pitch of ½ the diameter of the tube. Such a pattern is especially convenient when the aforementioned heating wire or tape is disposed on the tube's surface in a spiral pattern. Of course, the arrangement of the two spiral configurations is chosen so that the holes are not covered by the heating wire.

The filament may be passed through the chambers either continuously or in step-wise fashion. For the former method, suitable velocities of the filament will vary from filament to filament. However, in general it is desired to have velocities of up to 5 meters per second for commercial applications. For stepwise motion, of course, the residence time in each chamber is the same as that for continuous transport. In both cases, these times are selected so that both effective decontamination and uniform metallization results; so that the appropriate temperature is reached by the filament in the first chamber and so that in moving from the first to the second chamber the filament maintains a suitably high temperature to decompose the gaseous metal compound in the second chamber. For stepwise operation, the length of the steps is chosen so that only the length of filament which has been decontaminated in the first chamber passes into the second chamber. Moreover, the stepping time is minimized so that the temperature of the decontaminated filament is maintained high enough to decompose the metal compound in the second chamber.

The suitable pressure range for the gaseous metal compound contained in the annular region of the second chamber is the same as that for the first chamber. A diluent gas may be used along with the decomposable metal compound. Its partial pressure is not critical but should be selected so that the amount of decomposable gas is sufficient for adequate metallization.

As for the decontamination chamber, the minimum temperature of the inner tube of the metallization chamber is selected so that the gaseous metal compound reaches a suitably high temperature to attain turbulent jet stream flow. However, the most suitable temperature range varies with the decomposition temperature of the particular metal compound being used. In general, the temperature of the tube should be selected so that the metal compound attains a temperature less than its decomposition point whereby the metallization occurs only on the filament itself at a suitably low rate to ensure a smooth and continuous coating. The metal compound may also be pre-heated prior to introduction into the annular region. Of course, this will be most suitable if the compound is not a gas at room temperature. Alternatively, such a gas may be introduced into the chamber as an aerosol using fully conventional procedures consistent with the above requirements.

The filament can be passed through several two-chamber stages as described above in order to achieve any desired coating thickness. In such additional treatments, the first chamber serves merely to re-heat the partially coated filament to proper temperature for metallization since further decontamination is not required. Moreover, the chambers can be disposed vertically or horizontally. Of course, the filament can also be subjected to any conventional pre- or post-treatments such as short flame heating, infra red treatment, electrical discharge, ultrasonic cleaning, wash solutions and the like. Also, particularly when high heat resistant material such as quartz is used, a post-heating to approximately 300° C can be used to improve bonding.

The apparatus consists of two chambers 1 and 2 each comprising two concentric tubes as described above and connected by an intermediate chamber 3 as shown in FIG. 1. The filament 10 or the like to be metallized is drawn through the apparatus by any conventional means, such as by the series of pulleys 4. The filament is first passed through chamber 1 in order to decontaminate its surface. It then passes through intermediate chamber 3 which is divided into two separate regions by a diaphragm or membrane as discussed below. The region adjacent to the decontamination chamber 1 has an outlet port 6 for the inert gases introduced into chamber 1 through inlet port 5. Similarly, the region adjacent to the metallization chamber 2 has an outlet port 8 for the decomposable metal compound and inert gases introduced into chamber 2 through inlet port 7.

FIG. 2 shows a cross-sectional view of the decontamination chamber 1. The metallization chamber 2 is identical in all essential elements. As discussed above, these chambers consist of two concentric tubes 11 and 12 having different diameters so that an annular region 13 is formed between them. The outer tube 11 can be composed of any convenient substrate which can withstand the high temperature environment and, in the case of the metallization chamber 2, which is resistant to attack by the gaseous metal compound. Suitable such substrates include brass, stainless steel, glass, quartz and the like.

The inner tube 12 must also satisfy these requirements and, in addition, must be highly thermally conductive so that efficient heating of the tube can be achieved. Suitable substrates for tube 12 include stainless steel, brass and the like.

Sizes of the tubes are not critical. Generally, the outer tube has a diameter of from 1 to 3 cm and the inner tube from 0.2 to 0.6 cm. Similarly, the lengths of the tubes are not critical. Generally, they range from 10 to 50 cm, preferably 20 to 40 cm.

In the apparatus of FIG. 2, heating of the inner tube 12 is accomplished by means of a spirally wound, conventional, miniature, isulated heating wire 14. The heating wire extends throughout the lengths of the tubes in the chambers 1 and 2 and in the intermediate chamber 3. This enables efficient retention of heat by the filament 10 as it passes from chamber 1 into chamber 2. A series of thermocouples 15 are used to control the temperature in a conventional manner. The most important thermocouple is that placed on the inner tube 12 of the decontamination chamber 1 closest to the membrane. This allows a monitoring of the tube 12 temperature just prior to the filament 10 passing into the membrane 21. From this value, can be derived or estimated the temperature of the gas exiting the tube 12 at that point and the temperature of the filament going into the membrane 21. In the metallization chamber 2, a thermocouple should be used at the center of the inner tube, which is the hottest point in that tube.

The inner tube 12 also contains a series of perforations 16 along its surface. These perforations are shown in FIG. 2 as a series of small pinholes in a spiral configuration such that the spiral formed by the heating wire does not cover up the spiralling pinholes. The diameter of the pinholes is discussed above. The number of such perforations is not critical but should be chosen to ensure complete decontamination of the filament 10 in chamber 1 and complete and uniform metallization in chamber 2. The top of the outer tubes is joined to a flange 17 which provides a gas tight joint along the inner and outer perimeters of the annular space 13. The other end of the chamber is bounded by a plate providing a similar gas tight seal for the annular region and in addition, which contains a hole through which the inner tube extends to allow for entry (or exit) of the filament 10 in chamber 1 2. The inner tube thus is open to the atmosphere. The gas exits through the end 23 of the tube to prevent entry of air. On the exit chamber 2 end, tne structure is essentially the same, i.e., the inner tube extends through the end plate of the outer tube but a one-hole stopper 24 is placed in the end of the exit tube, the hole in it being slightly larger than the filament to prevent loss of the carbonyl and to prevent entry of air into the metallization chamber. Thus, the gas in the metallization chamber leaks out slightly through the stopper with its center hole. This is designed so that only a small, acceptable amount of carbonyl is lost. Typical filament sizes are from 7 $\mu$m (a mono-fiber) to 6,000 $\mu$m (bundled fibers).

The inner tube 12 from both chambers extends into the intermediate chamber 3. The part of the tube 12 in chamber 3 has a series of holes 19 which continue the spiral pattern 14 of the remaining portion of the tube. However, these holes can be made larger (e.g., from 1 to 3 mm) to improve the efficiency of the flow of the gas inside the tube 12 into the chamber 3 and out through the outlet port 6.

Details of the intermediate chamber 3 are shown in FIG. 3. A membrane or diaphragm 20 is provided to separate chamber 3 into two regions, one in association with the decontamination chamber 1 and one with the metallization chamber 2. The diaphragm has a small pinhole 21 which allows the filament 10 to pass through but which maintains separation between the two regions. In this way the inert gas emanating from the decontamination chamber is allowed to flow out through port 6 before it can pass into the region of chamber 3 which is in communication with chamber 2. Thus, unnecessary dilution of the decomposable metal compound is prevented. Similarly, the gases present in the chamber 2 (undecomposed metal compound, CO, NO, etc.) are kept from contaminating chamber 1. The undecomposed metal compound can be recovered and recirculated into the metallization chamber.

Suitable materials for the membrane 21 include teflon, glass quartz and other heat resistant materials such as polyimides and the like. Typical thicknesses range from 0.2 to 5 mm, preferably from 0.2 to 0.3 mm. The diameter of the pinhole 21 varies with that of the filament. It simply is chosen to effectively separate the chambers 1 and 2 as described above. A suitable hole size is about 1½ times the filament diameter.

In order to ensure that the temperature of the decontaminated filament 10 is maintained suitable to decompose the metal compound, the inner tubes of chambers 1 and 2 are heated throughout their lengths within chamber 3. Moreover, as shown in FIG. 3, the intermediate chamber 3 can be provided with a cooling jacket 22 having inlet and outlet ports 9 and 9' (FIG. 1), through which a conventional cooling fluid such as water can be passed to keep the walls 22 of chamber 3 down to the temperature of chamber 2. Using this combination of small pinhole sizes, thin membrane and close proximity to the heated inner tubes, the conventional problem of undesired cooling of a filament as it passes from a conventional cleaning treatment to a conventional metallization treatment is avoided.

Two or more of the apparatus shown in FIG. 1 can be serially arranged to provide any total metallization thickness desired.

Having generally described the invention, a more complete understanding can be obtained by reference to certain examples, which are included for purposes of illustration only and are not intended to be limiting unless otherwise specified.

EXAMPLES 1 – 3

Nickel carbonyl was coated onto the substrate shown in the Table below under conditions also shown in the Table.

| Fiber | Filament Size (μm) | Gas Pressure (mm Hg) | Temperature (° C) | Drawing Velocity (cm/sec) | Nickel Carbonyl Concentration |
|---|---|---|---|---|---|
| Glass | 9 | 50 | 170 | 30 | 4 |
| Polyester | 9 | 50 | 150 | 30 | 5 |
| Carbon | 7 | 70 | 180 | 50 | 5 |

The gas pressure refers to the pressure of the carbonyl and the heating gas in the decontamination chamber. Both chambers were run under the same pressure. The temperature is the fiber temperature. Hydrogen was used in both chambers. In the decontamination chamber, it prevents beginning oxidation and also has a high thermoconductivity. It was also used for the carrier gas for the nickel carbonyl (NiCO$_4$). The volume percent of the nickel carbonyl is listed in the table. The membrane in the intermediate chamber was made of teflon. Its thickness was 5 mm, and the hole size was 500 μmm. The filament was moved through the chamber continuously. The resulting coating thicknesses were 3, 1 and 5 μm for the glass, polyester and carbon filaments, respectively. Using the results of observations with an electron microscope, calculations showed only a 0.002% hole content in the coatings.

Having now fully described the invention, it will be apparent to one of ordinary skill in the art that many changes and modifications can be made thereto without departing from the spirit or scope of the invention as set forth herein.

What is claimed as new and intended to be covered by letters patent is:

1. A method for decontaminating and subsequently metallizing a filament which comprises passing the filament through the inner tube of a first chamber for decontamination which comprises two concentric tubes having an annular space therebetween, the inner tube of which has a series of fine holes therein; wherein said inner tube is heated and said annular space contains an inert gas such that said gas flows through said holes in heated jet streams which impinge upon said filament, thereby heating and decontaminating said filament;

passing said heated and decontaminated filament into a second chamber for metallization also comprising two concentric tubes having an annular space therebetween, the inner tube of which has a series of fine holes therein; wherein said inner tube of said second chamber is heated and said annular space of said second chamber contains a gaseous, thermally decomposable metal compound such that said gaseous metal compound flows through said holes in heated jet streams and impinges upon said heated and decontaminated filament, thereby thermally decomposing said metal compound and metallizing said filament;

disposing an intermediate chamber in alignment with and with ends in sealing relationship with the respective ends of said decontamination and metallization chambers and having a membrane disposed intermediately and transversely thereof;

communicating each said inner tube with its associated section of the intermediate chamber drawing off gaseous material entering each said section from said inner tubes; and passing said heated and decontaminated filament through said intermediate chamber and through a pinhole aperture in said membrane prior to said passing through the metallization chamber.

2. The method of claim 1, wherein said filament has a fibrous structure.

3. The method of claim 1, wherein each said fine holes have a diameter of from 0.1 to 0.5 mm.

4. The method of claim 3, wherein said fine holes are arranged in a spiral configuration on said inner tubes.

5. The method of claim 4, wherein said inner tubes are heated by means of insulated heating wires arranged in spiral configurations on the outer surfaces of said inner tubes such that said spirally arranged fine holes are not covered.

6. The method of claim 1, wherein said inert gas is He, Ar, $CO_2$, $H_2$, CO, $N_2$, inert organic vapors or mixtures thereof.

7. The method of claim 1, wherein said decomposable metal compound is a metal carbonyl, nitrosyl or ethylacetonate.

8. The method of claim 1, wherein said filament is made of carbon, graphite, glass, quartz, asbestos, polycarbonate, polyacrylinitrile, polyester, or polyamide.

* * * * *